United States Patent
Yin et al.

(10) Patent No.: US 12,224,009 B2
(45) Date of Patent: Feb. 11, 2025

(54) ULTRA-COMPACT CAM ARRAY BASED ON SINGLE MTJ AND OPERATING METHOD THEREOF

(71) Applicant: ZHEJIANG UNIVERSITY, Zhejiang (CN)

(72) Inventors: Xunzhao Yin, Zhejiang (CN); Zeyu Yang, Zhejiang (CN); Cheng Zhuo, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 243 days.

(21) Appl. No.: 18/072,681

(22) Filed: Nov. 30, 2022

(65) Prior Publication Data

US 2023/0377650 A1    Nov. 23, 2023

(30) Foreign Application Priority Data

May 17, 2022  (CN) .......................... 202210535147.5

(51) Int. Cl.
  *G11C 15/02*     (2006.01)
(52) U.S. Cl.
  CPC .................. *G11C 15/02* (2013.01)
(58) Field of Classification Search
  CPC ... G11C 15/046; G11C 15/02; G11C 11/1673; G11C 7/06; G11C 7/18; G11C 11/1675; G11C 5/147; G11C 11/40; G11C 8/10; G11C 8/14
  See application file for complete search history.

(56) References Cited

U.S. PATENT DOCUMENTS 7,193,877 B1 *   3/2007   Yelluru .................. G11C 29/28
                                                365/49.1

OTHER PUBLICATIONS

W. Xu, T. Zhang and Y. Chen, "Design of Spin-Torque Transfer Magnetoresistive RAM and CAM/TCAM with High Sensing and Search Speed," in IEEE Transactions on Very Large Scale Integration (VLSI) Systems, vol. 18, No. 1, pp. 66-74, Jan. 2010 (Year: 2010).*

B. Razavi, "The StrongARM Latch [A Circuit for All Seasons]," in IEEE Solid-State Circuits Magazine, vol. 7, No. 2, pp. 12-17, Spring 2015 (Year: 2015).*

(Continued)

*Primary Examiner* — Alfredo Bermudez Lozada
*Assistant Examiner* — James S Wells
(74) *Attorney, Agent, or Firm* — JCIPRNET

(57) ABSTRACT

Disclosed in the present invention is an ultra-compact CAM array based on a single MTJ and an operating method thereof. The CAM array comprises an M*N CAM core for storing contents, additional reference rows for storing "0" and "1" and reference columns for storing "0" and "1", a row decoder, a column decoder, transmission gates ENs, write drivers WDs, search current sources $I_{search}$s and two-stage detection amplifiers. The present invention utilizes 1T-1MTJ cells to construct the CAM array, and combines the advantages of the MTJ and CMOS. While ensuring search energy efficiency, a unique structure of the MTJ is utilized to implement a less area overhead and a lower search delay compared with a traditional CMOS-based CAM, and non-volatility is achieved.

7 Claims, 12 Drawing Sheets

(56) References Cited

OTHER PUBLICATIONS

K. Monga, L. Maheshwari, N. Chaturvedi and S. Gurunarayanan, "Twin-Coupled Sense Amplifier to improve margin in 1T-1MTJ based MRAM array," 2020 24th International Symposium on VLSI Design and Test (VDAT), Bhubaneswar, India, 2020, pp. 1-4 (Year: 2020).*

T. Kobayashi, K. Nogami, T. Shirotori, Y. Fujimoto and O. Watanabe, "A current-mode latch sense amplifier and a static power saving input buffer for low-power architecture," 1992 Symposium on VLSI Circuits Digest of Technical Papers, Seattle, WA, USA, 1992, pp. 28-29, doi: 10.1109/VLSIC.1992.229252.*

Anh Tuan Do et al., "Design of a Power-Efficient CAM Using Automated Background Checking Scheme for Small Match Line Swing", 2013 Proceedings of the ESSCIRC (ESSCIRC), Sep. 16-20, 2013, pp. 209-212.

Shoun Matsunaga et al., "Design of a Nine-Transistor/Two-Magnetic-Tunnel-Junction-Cell-Based Low-Energy Nonvolatile Ternary Content-Addressable Memory", Japanese Journal of Applied Physics, Feb. 20, 2012, pp. 1-6.

Byungkyu Song et al., "A 10T-4MTJ Nonvolatile Ternary CAM Cell for Reliable Search Operation and a Compact Area", IEEE Transactions on Circuits and Systems II: Express Briefs, Jun. 2017, pp. 700-704.

Chengzhi Wang et al., "A Novel MTJ-Based Non-Volatile Ternary Content-Addressable Memory for High-Speed, Low-Power, and High-Reliable Search Operation", IEEE Transactions on Circuits and Systems I: Regular Papers, Apr. 2019, pp. 1454-1464.

Chengzhi Wang et al., "Design of Magnetic Non-Volatile TCAM With Priority-Decision in Memory Technology for High Speed, Low Power, and High Reliability", IEEE Transactions on Circuits and Systems I: Regular Papers, Feb. 2020, pp. 464-474.

\* cited by examiner

ULTRA-COMPACT CAM ARRAY BASED ON SINGLE MTJ AND OPERATING METHOD THEREOF

CROSS-REFERENCE TO RELATED APPLICATION

This application claims the priority benefit of China application no. 202210535147.5, filed on May 17, 2022. The entirety of each of the above mentioned patent applications is hereby incorporated by reference herein and made a part of this specification.

FIELD OF TECHNOLOGY

The present invention relates to the storage field, in particular to an ultra-compact CAM array based on a single MTJ and an operating method thereof. An MTJ device is considered to be used for the design of an ultra-compact high-performance CAM with non-volatility characteristics.

BACKGROUND

With the advent of the era of big data, more and more data-intensive applications need a Computing in Memory (CiM) hardware with parallel data processing capability to overcome the "memory wall" bottleneck of a Von Neumann architecture, especially for data search operations. As a promising hardware solution for in-memory computing, a Content Addressable Memory (CAM) implements a parallel search function by addressing the contents of a storage array given an input query. It has great potential in a variety of application scenarios such as pattern matching, IP routers, and machine learning.

Since conventional CMOS based CAM designs suffer from defects of a high leakage power consumption and a low area density, researchers are looking for device-level alternatives to build compact CAM arrays. In recent years, many new emerging Non-Volatile Memories (eNVMs) with a near zero leakage power consumption, high storage density and a high switching speed are called an ideal choice in the development trend of the CAM. These new emerging non-volatile memories comprise a Resistive Random Access Memory (ReRAM) and a Phase-Change Memory (PCM), a Ferroelectric Field Effect Transistor (FeFET) and a Magnetic Tunnel Junction (MTJ), etc. High/low resistance states of these novel non-volatile memory devices can be encoded as "1"/"0", enabling a more compact CAM design.

The existing MTJ-based CAM technologies can be classified into two categories: one is a CAM cell based on a voltage division search, and the other is a CAM cell based on a latch search. For the design of CAM based on the voltage division search, the accuracy of the CAM search is sensitive to the process change of the MTJ because a switching ratio of the MTJ is limited. In order to improve search reliability, another kind of CAM design based on the latch search adds a differential detection and positive feedback circuit in the cell to improve a detection margin, but it significantly increases the number of transistors in the cell. In addition, both technologies use a plurality of transistor and MTJ pairs for complementary data storage to facilitate the search, but this leads to a large area overhead and thus fails to take full advantage of the compact and CMOS compatibility of the MTJ. Based on the above problems of the existing technology, it is necessary to design a emerging CAM design based on MTJ to reduce an area cost of the CAM cell while maintaining high search reliability and high energy efficiency.

SUMMARY

The purpose of the present invention is to provide a CAM design based on a single MTJ to solve the problems of a large area cost and poor performance of the existing CAM, which achieves a lower area cost and better performance, and to propose a segmented scheme to improve the scalability.

The object of the present is realized by the following technical schemes:

An ultra-compact CAM array based on a single MTJ, wherein the CAM array comprises an M*N CAM core for storing contents, additional reference rows for storing "0" and "1" and reference columns for storing "0" and "1", a row decoder, a column decoder, transmission gates ENs, write drivers WDs, search current sources $I_{search}$s and two-stage detection amplifiers.

Further, the CAM core comprises M*N CAM cells, and each CAM cell comprises 1MTJ and 1NMOS;

the two terminals of the MTJ in each CAM cell are respectively connected with a bit line BL and the drain of an NMOS drain, the gate of the NMOS is connected with a word line WL, and the source of the NMOS is connected with another bit line BLB;

bit lines of the CAM cells in each row in the CAM array are connected to each other, and each column shares the same longitudinal WL.

Further, the row decoder controls the transmission gates ENs and the search current sources $I_{search}$s, the column decoder controls the WLs, the write drivers WDs are divided into write drivers $WD_1$s and write drivers $WD_2$s, the write drivers $WD_1$s are connected to the BLs through the transmission gates ENs, the write drivers $WD_2$s are connected to the BLBs, the BL of each storage row in the CAM core is connected to positive inputs of two two-stage detection amplifiers SAs, and the two-stage detection amplifier SAs are divided into two-stage detection amplifiers $SA_0$s and two-stage detection amplifiers $SA_1$s, the BL of the reference row for storing "0" connects to negative inputs of all the two-stage detection amplifiers $SA_0$s, and the BL of the reference row for storing "1" connects to negative inputs of all the two-stage detection amplifiers $SA_1$s.

Further, two types of storing are performed on the MTJ by a bidirectional current generated by two write drives WDs in each row: "0" and "1".

Further, during the search, a read voltage and a reference voltage are respectively generated on the BLs of the storage row and the reference row by the search current source $I_{search}$, and information about match or not is obtained through the two two-stage detection amplifiers SAs in each row.

Further, all 1T-1MTJ cells in the reference row for storing "0" and the reference column for storing "0" store data "0", all 1T-1MTJ cells in the reference row for storing "1" and the reference column for storing "1" store data "1", and at the intersection of the two reference rows and the two reference columns are four 2T cells for ensuring that a reference voltage on the BL of the reference row is different from read voltages of the other storage rows during the search.

Further, the two-stage detection amplifier SA comprises a first differential pre-amplifier and a second-stage dynamic latch voltage comparator.

The present invention also provides an operating method of the CAM array as described above, wherein the method comprises:

before the CAM array starts to work, data storage is performed on each cell, that is, after the information is encoded into a binary sequence, the 1MTJ is written through a bidirectional current;

for each search operation, a two-step search scheme is utilized:

a first step: enabling a WL corresponding to all "0" bits in a search sequence and a WL in the reference column for storing "0", setting WLs of the remaining columns to 0, letting BLB be grounded, applying the search current to generate a read voltage $V_{SEARCH0}$ on a storage row BL and generate a reference voltage $V_{REF0}$ on BL of the reference row for storing "0", and when a clock signal CLK is at a high level, precharging the two output terminals of the two-stage detection amplifier $SA_0$ to a high level; when the CLK goes low, if the row has a mismatch condition that "1" is stored while "0" is searched, letting $V_{SEARCH0}$ be greater than $V_{REF0}$, so that a reverse output terminal $ML_0$ of the two-stage detection amplifier $SA_0$ is pulled down to ground; and if the row matches, remaining $ML_0$ at a high level;

a second step: enabling a WL corresponding to all "1" bits in a search sequence and a WL in the reference column for storing "1", setting WLs of the remaining columns to 0, letting BLB be grounded, applying the search current to generate a read voltage $V_{SEARCH1}$ on a storage row BL and generate a reference voltage $V_{REF1}$ on the reference row BL for storing "1", and when a clock signal CLK is at a high level, precharging the two output terminals of the two-stage detection amplifier $SA_1$ to a high level; when the CLK goes low, if the row has a mismatch condition that "0" is stored while "1" is searched, letting $V_{SEARCH1}$ be smaller than $V_{REF1}$, so that a positive output terminal $ML_1$ of the two-stage detection amplifier $SA_1$ is pulled down to ground; and if the row matches, remaining $ML_1$ at a high level;

when a segmentation design is utilized for performing a long-byte search, the ML of each segment is shorted by a logic circuit to obtain search results of the first step and/or the second step, and in a global detector, the search result in the first step is connected to an AND gate by a D-latch and the search result in the second step is also connected to the AND gate to obtain the search result of the whole row; and in the search phase of the second step, the output of the AND gate is observed, and the row matches if the output is at a high level.

The present invention has the following beneficial effects:

(1) For the CAM design of 1T-1MTJ, different from the default CAM cell that adopts a plurality of MTJs for complementary storage and differential detection, each cell of this CAM only comprises 1 MTJ and 1 NMOS. With the help of additional reference rows and reference columns, the two-stage detection amplifier is used to obtain the matching result of the whole row. The search energy efficiency is guaranteed while the search delay is reduced. Due to the small number of devices in the 1T-1MTJ cell, the CAM array significantly improves area efficiency. Since the 1T-1MTJ is the mainstream MTJ product design, the CAM of the present invention reduces the design overhead and can bring about the reduction of production cost. In addition, this design can also be used by other NVM devices and has versatility.

(2) For the 1T-1MTJ CAM design, the segmented design can be used when performing a long byte search, each segment is equipped with the additional reference rows and the reference columns and two-stage amplifier, and performs the search in the segment in parallel in a search procedure. The output of each segment generated by the two-stage detection amplifier is short-circuited by the logic circuit, and the search results are obtained by the global detector. This parallel data search design method improves the scalability while ensuring the reliability of the search.

DESCRIPTION OF THE EMBODIMENTS

The present invention is further described in detail in combination with the accompany drawings and specific embodiments.

Figure 1:
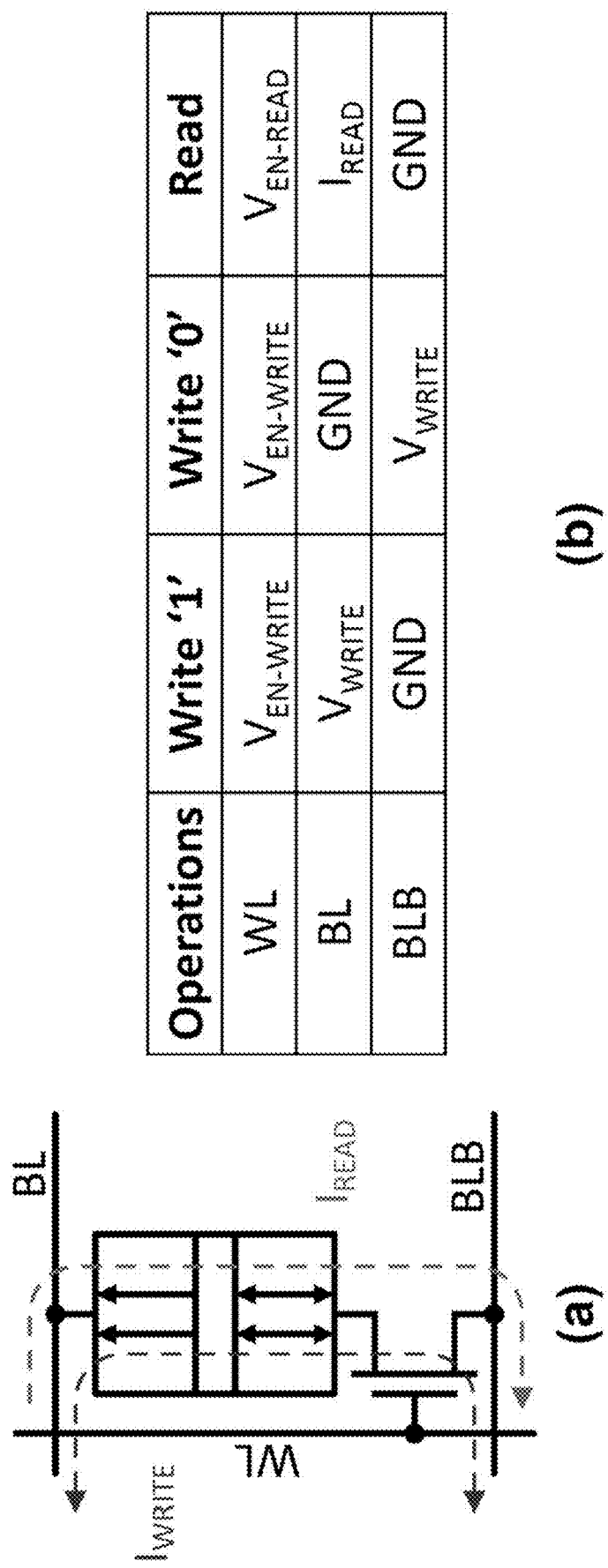
FIG. 1 is a schematic diagram of a structure of a CAM cell of a 1T-1MTJ in part (a) and an operation principle in part (b) thereof.

1. A 1T-1MTJ Cell Structure and Operation Process:

As shown in part (a) of FIG. 1, a 1T-1MTJ cell comprises a MTJ and a NMOS, the two terminals of the MTJ device are respectively connected with a bit line BL and an NMOS drain, the NMOS gate is connected with a word line WL, and an NMOS source is connected with another bit line BLB. When magnetization directions of a free layer and a fixed layer in the MTJ are the same, the MTJ is in a parallel state, and the corresponding equivalent resistance $R_P$ is small, indicating that "0" is stored; and when the magnetization directions are opposite, the MTJ is in an anti-parallel state, and the corresponding equivalent resistance is $R_{AP}$ large, indicating that "1" is stored. A switching ratio of the MTJ is represented by $$TMR(TMR = \frac{R_{AP} - R_P}{R_P}).$$

Figure 2:
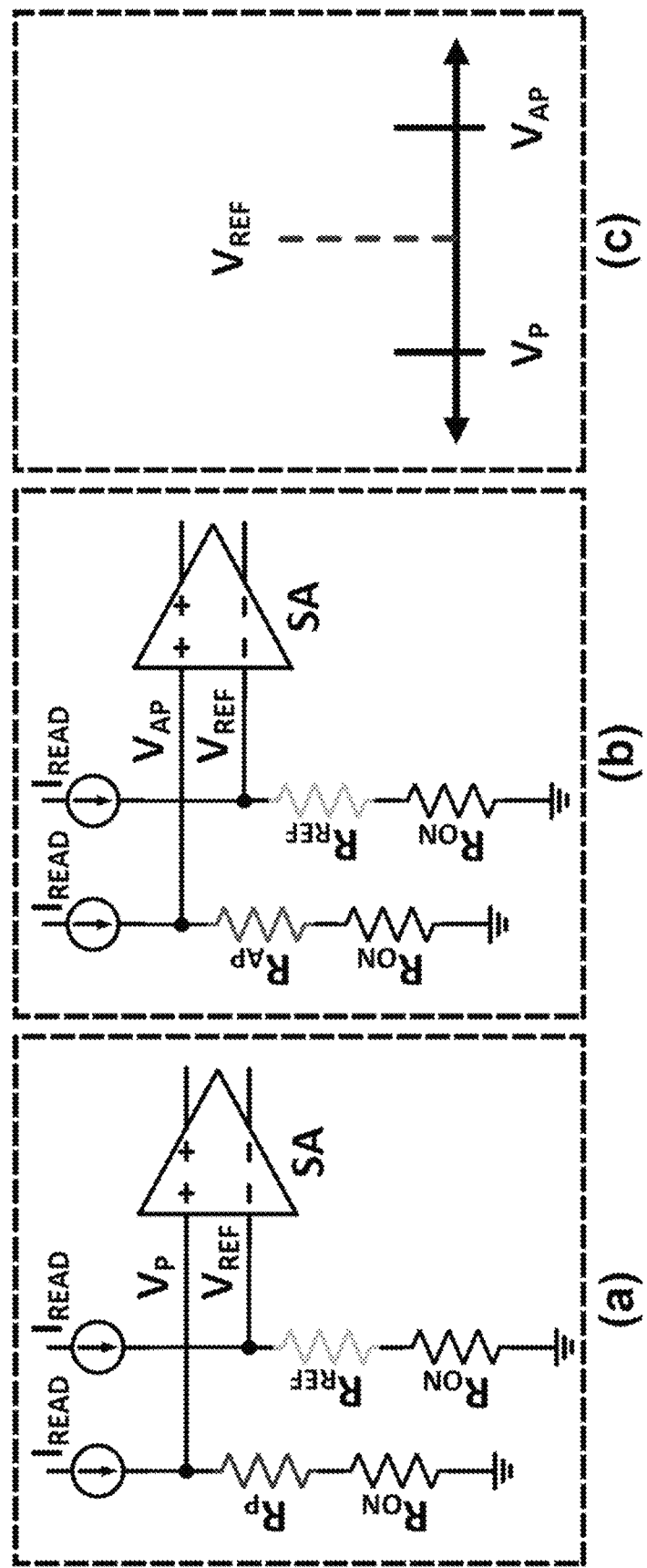
FIG. 2 is a voltage comparison schematic diagram of $V_P$ and $V_{REF}$ in part (a) and $V_{AP}$ and $V_{REF}$ in part (b) and a size relationship diagram of them in part (c)

Bias conditions of read and write operations of the 1T-1MTJ cell are shown in part (b) of FIG. 1. When writing data, the WL is set to $V_{EN\text{-}WRITE}$ to turn on a transistor and provide appropriate bias voltages on the BL and BLB to generate a large current to control the magnetization direction of the free layer in the MTJ and realize writing "1" or "0". When reading data, as shown in FIG. 2, the WL is set to $V_{EN\text{-}READ}$ to turn on the transistor and a read current $I_{READ}$ is applied on the cell, so that a read voltage $V_P$ ($V_{AP}$) corresponding to the state "0" ("1") is generated on a BL node. This voltage is compared with a reference voltage $V_{REF}$ through a two-stage detection amplifier SA. Note that $R_{REF}$ in part (a) and part (b) of FIG. 2 is the equivalent resistance of a bias transistor, as shown in part (c) of FIG. 2, and the magnitude of the corresponding reference voltage $V_{REF}$ on the BL is between $V_P$ and $V_{AP}$ to achieve a read operation.

Figure 3:
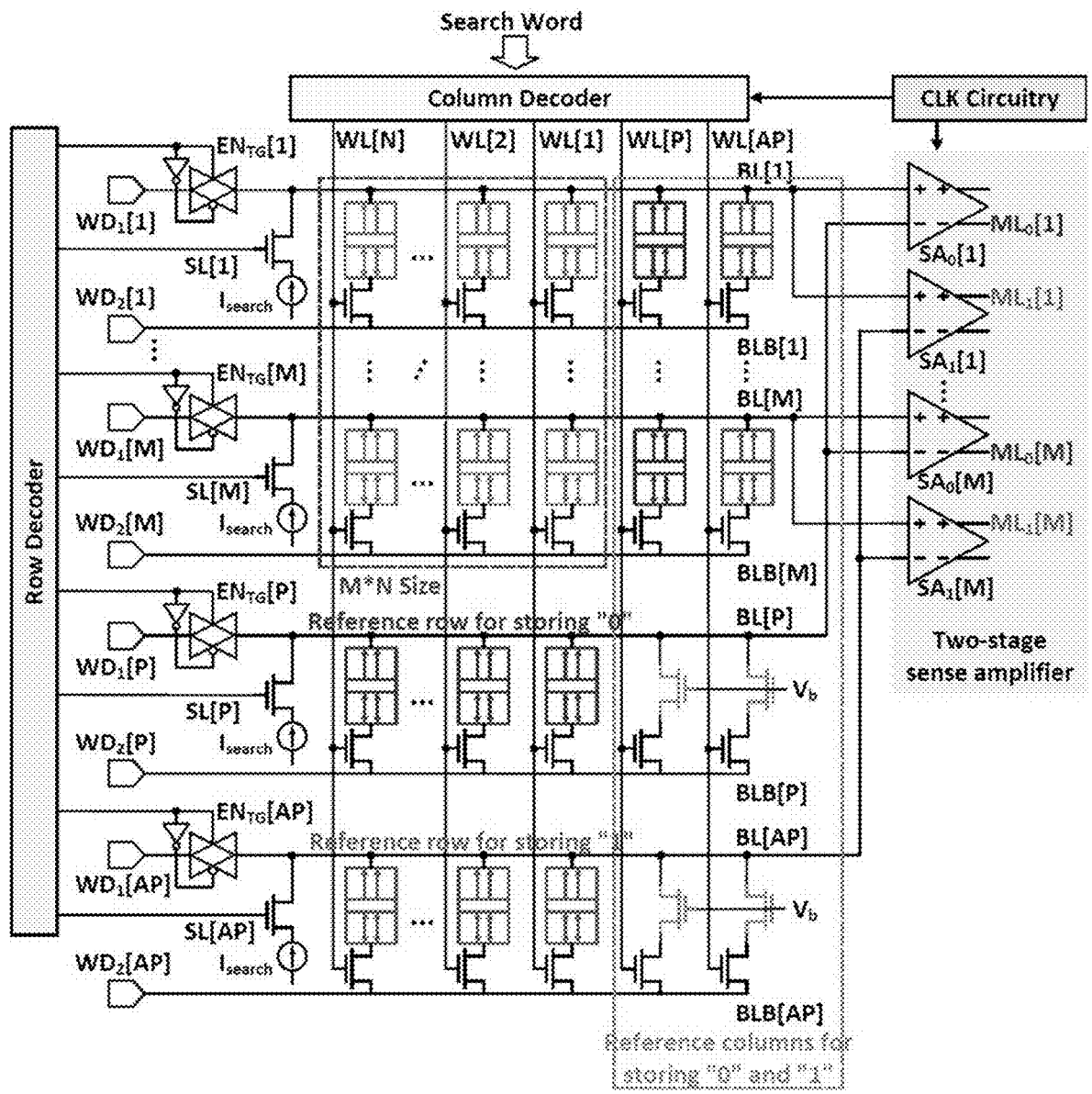
FIG. 3 is a schematic diagram of a 1T-1MTJ CAM array with the size of M*N.

2. Overall Structure and Operation Process of a CAM Array of 1T-1MTJ:

As shown in FIG. 3, the CAM array of 1T-1MTJ comprises an M*N CAM core for storing contents, additional reference rows for storing "0" and "1" and reference columns for storing "0" and "1", a row decoder, a column decoder, transmission gates ENs, write driver WDs, search current sources $I_{search}$s and two-stage detection amplifiers SAs etc. All 1T-1MTJ cells in the reference row for storing "0" and reference column for storing "0" store data "0", and all 1T-1MTJ cells in the reference row for storing "1" and reference column for storing "1" store data "1". Four cells located at the intersection of the reference row and reference column are a 2T structure, wherein one NMOS is also controlled by the word line WL, and another NMOS is under the control of gate potential $V_b$ with an equivalent resistance $R_{REF}$ between $R_P$ and $R_{AP}$. The 2T cell ensures that the reference voltage on the BL of the reference row is different from read voltages of the other storage rows during the search. The BL of the storage row is connected to positive input terminals of two two-stage detection amplifiers SAs, and the two two-stage detection amplifiers SAs are a two-stage detection amplifier $SA_0$ and a two-stage detection amplifier $SA_1$ respectively. The BL of the reference row storing "0" is connected to negative input terminals of all the two-stage detection amplifiers $SA_0$s, and the BL of the reference row storing "1" is connected to negative input terminals of all two-stage detection amplifiers $SA_1$s.

Figure 4:
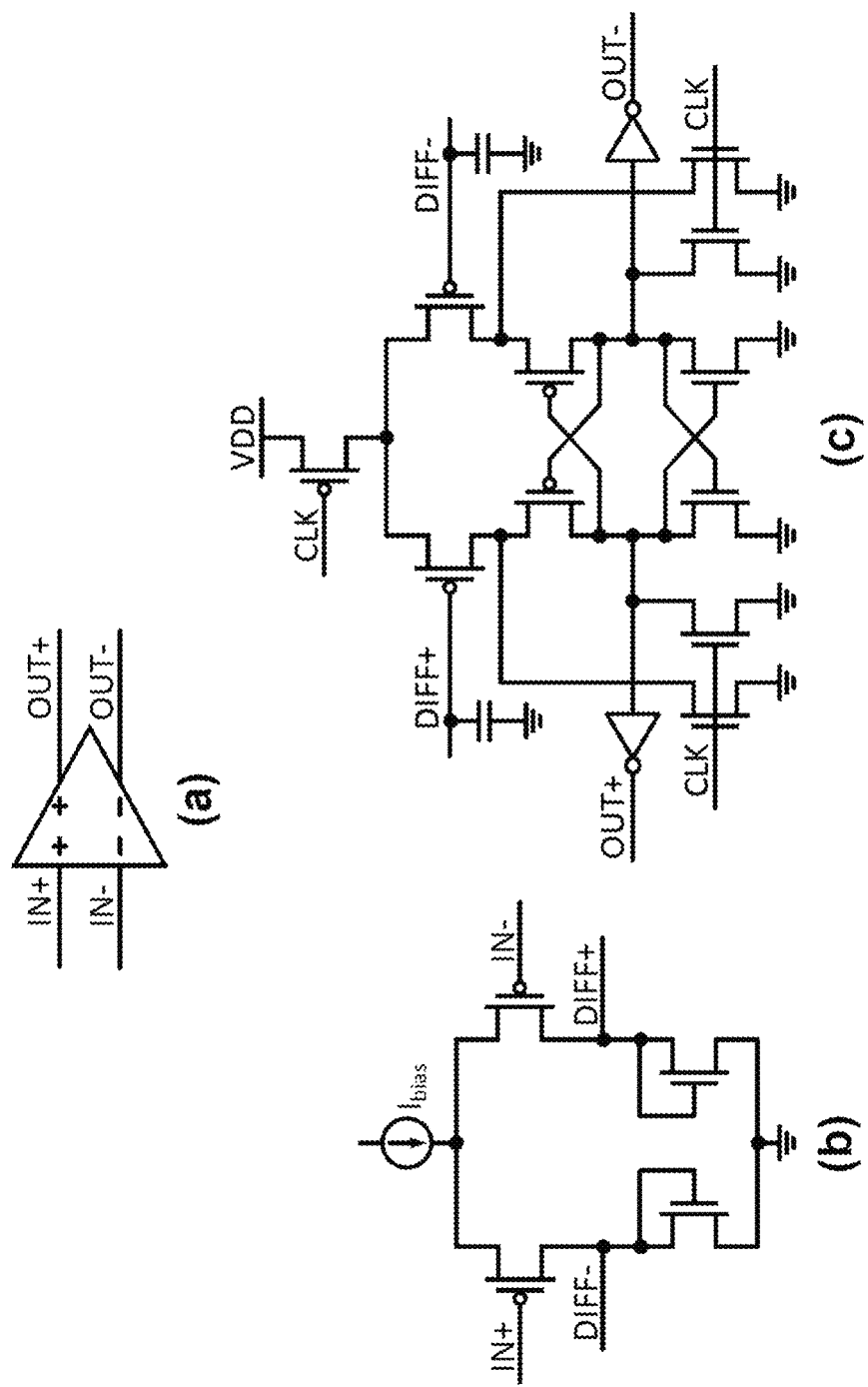
FIG. 4 is a schematic diagram of symbols of the two-stage detection amplifier in part (a), a first-stage differential pre-amplifier in part (b), and a second-stage dynamic latch voltage comparator in part (c)

FIG. 4 shows a specific structure of the two-stage detection amplifier SA, which comprises a first-stage differential pre-amplifier and a second-stage dynamic latch voltage comparator. When a clock signal CLK is at a high level, the two output terminals of the two-stage detection amplifier SA are precharged to a high level; when CLK is at a low level, a voltage difference between the two input terminals of the two-stage detection amplifier SA is amplified by a positive feedback of a cross-coupled invertor in a second-stage dynamic latch voltage comparator, so that the output terminals of the two-stage detection amplifier SA produces a comparison result. If the two-stage detection amplifier SA directly uses the second-stage dynamic latch voltage comparator, when CLK jumps, due to imbalance of capacitor loads on the two input terminals of the two-stage detection amplifier SA (namely, the BL of the storage row and the BL of the reference row), the two BLs have different levels of feedback noise, leading to a differential error. Therefore, the first-stage differential pre-amplifier is introduced to suppress the feedback noise and improve the search reliability.

The whole operation process of the CAM array of the 1T-1MTJ is as follows:

(1) Before the 1T-1MTJ CAM array starts to work, data is stored for each CAM cell, that is, after information is encoded into binary data, two Write Drivers WDs in each row provide a sufficient write current by enabling the transmission gates EN and WL. The write operation is performed row by row, which is divided into two steps of writing "0" and writing "1". During the writing operation, the transmission gates ENs of all unselected rows and WLs of unselected columns should be turned off to avoid to write interference.

Figure 5:
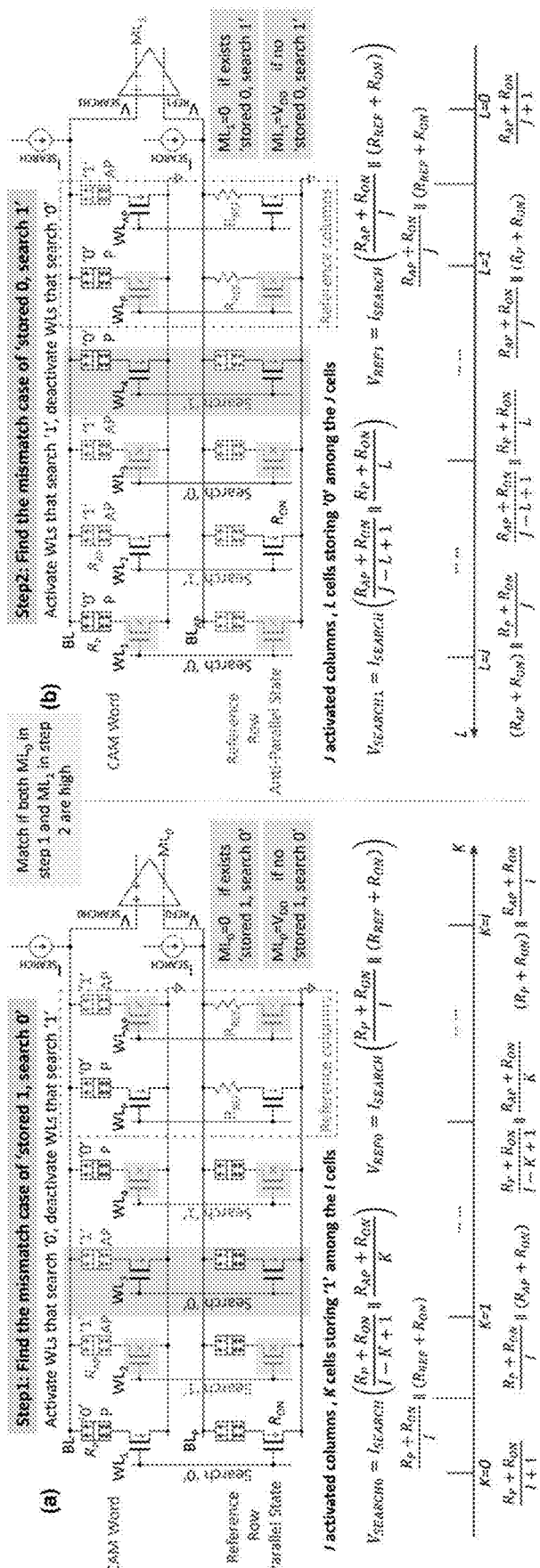
FIG. 5 is a principle schematic diagram of a first step in part (a) and a second step of a two-step search scheme of a 1T-1MTJ CAM array in part (b)

(2) For each search operation, a two-step search scheme is utilized:

(2.1) Step 1: finding all the mismatch conditions that "1" is stored while "0" is searched. As shown in part (a) of FIG. 5, a WL corresponding to all "0" bits in a search sequence and a WL of the reference column storing the "0" are enabled, WLs of the remaining columns are set to 0, the BLB is grounded, and the transmission gate is turned off. Assuming that there are K cells storing "1" out of I cells involved in the search for "0" in a row, there are I-K cells storing "0" in practice, as well as a cell storing "0" in the reference column storing "0". The resistance of the I+1 cells connected in parallel is $$\frac{R_P + R_{on}}{I - K + 1} // \frac{R_{AP} + R_{on}}{K},$$

where $R_{on}$ is on-resistance of NMOS controlled by WL in each cell. Then a read voltage $V_{SEARCH0}$ generated on the BL of this row by applying the search current $I_{SEARCH}$ is as follows:

$$V_{SEARCH0} = I_{SEARCH}(\frac{R_P + R_{on}}{I - K + 1} // \frac{R_{AP} + R_{on}}{K})$$

At the same time, I cells storing "0" and 1 2T cell are enabled on the reference row storing "0", and the resistance after being connected in parallel is $$\frac{R_P + R_{on}}{I}//(R_{ref} + R_{on}),$$

and then the reference voltage $V_{REF0}$ generated by applying the search current $I_{SEARCH}$ on the BL of the reference row storing "0" is as follows:

$$V_{REF0} = I_{SEARCH}(\frac{R_P + R_{on}}{I}//(R_{ref} + R_{on}))$$

When CLK is at a high level (the precharging stage), the two output terminals of the two-stage detection amplifier $SA_0$ are precharged to a high level; when CLK becomes low (the search stage), if there is a mismatch condition that "1" is stored while "0" is searched in the row, $V_{SEARCH0}$ is greater than $V_{REF0}$, so that $ML_0$ at the reverse output terminal of the two-stage detection amplifier $SA_0$ is pulled down to the ground; and if it matches for this row, $V_{SEARCH0}$ is less than $V_{REF0}$ and $ML_0$ remains a high level.

(2.2) Step 2: finding all the mismatch conditions that "0" is stored while "1" is searched. As shown in part (b) of FIG. 5, a WL corresponding to all "1" bits in a search sequence and a WL of the reference column storing the "1" are enabled, WLs of the remaining columns are set to 0, the BLB is grounded, and the transmission gate is turned off. Assuming that there are L cells storing "0" out of J cells involved in the search for "1" in a row, there are J-L cells storing "1" in practice, as well as a cell storing "1" in the reference column storing "1". The resistance of the J+1 cells connected in parallel is $$\frac{R_{AP} + R_{on}}{J - L + 1}//\frac{R_P + R_{on}}{L},$$

and then a read voltage $V_{SEARCH1}$ generated on the BL of this row by applying the search current $I_{SEARCH}$ is as follows:

$$V_{SEARCH1} = I_{SEARCH}(\frac{R_{AP} + R_{on}}{J - L + 1}//\frac{R_P + R_{on}}{L})$$

At the same time, J cells storing "0" and 1 2T cell are enabled on the reference row storing "1", and the resistance after being connected in parallel is $$\frac{R_{AP} + R_{on}}{J}//(R_{ref} + R_{on}),$$

and then the reference voltage $V_{REF1}$ generated by applying the search current $I_{SEARCH}$ on the BL of the reference row storing "1" is as follows:

$$V_{REF1} = I_{SEARCH}(\frac{R_{AP} + R_{on}}{J}//(R_{ref} + R_{on}))$$

When CLK is at a high level (the precharging stage), the two output terminals of the two-stage detection amplifier $SA_1$ are precharged to a high level; when CLK becomes low (the search stage), if there is a mismatch condition that "0" is stored while "1" is searched in the row, $V_{SEARCH1}$ is less than $V_{REF1}$, so that $ML_1$ at the positive output terminal of the two-stage detection amplifier $SA_0$ is pulled down to the ground; and if it matches for this row, $V_{SEARCH1}$ is greater than $V_{REF1}$ and $ML_1$ remains a high level.

Figure 6:
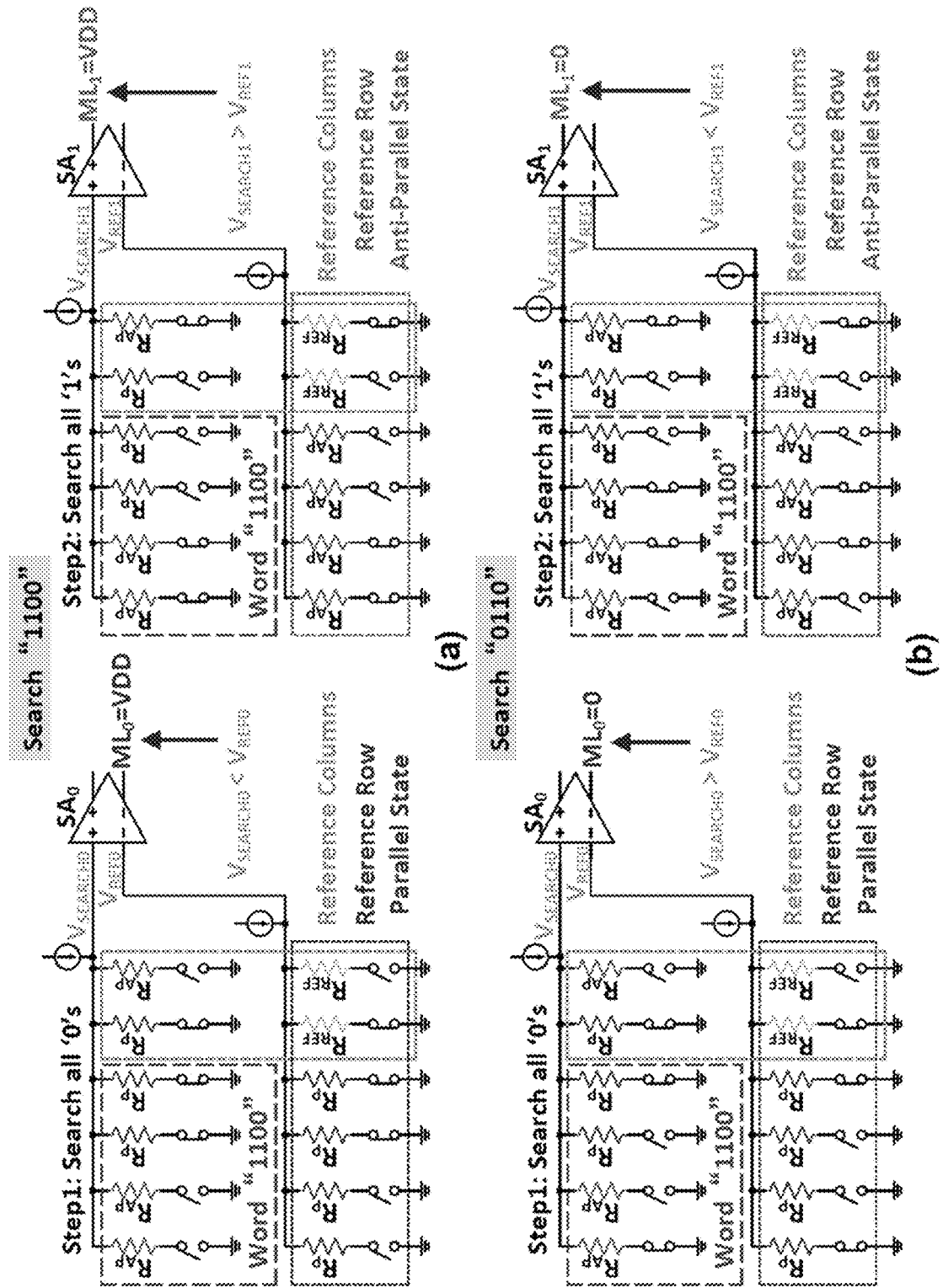
FIG. 6 is a schematic diagram of searching "1010" in part (a) and "0110" in part (b) for stored content "1010" under a two-step search operation.

Therefore, combining the above two-step search, only if $ML_0$ is high in the first step and $ML_1$ is high in the second step, it indicates that the stored content and the search sequence match, otherwise there is a mismatch. FIG. 6 shows an example of the two-step search scheme when the store content is "1100". When the matched data "1100" is searched, as shown in part (a) of FIG. 6, $ML_0$ remains high in the first step and $ML_1$ remains high in the second step, so the search result matches. When the mismatched data "0110" is searched, as shown in part (a) of FIG. 6, in the first step, $ML_1$ is pulled down to the bottom in the search stage, and in the second step, $ML_1$ is pulled down to the bottom in the search stage, so the search result does not match. By using the above two-step search scheme, a parallel search function is realized in the 1T-1MTJ CAM array.

Figure 7:
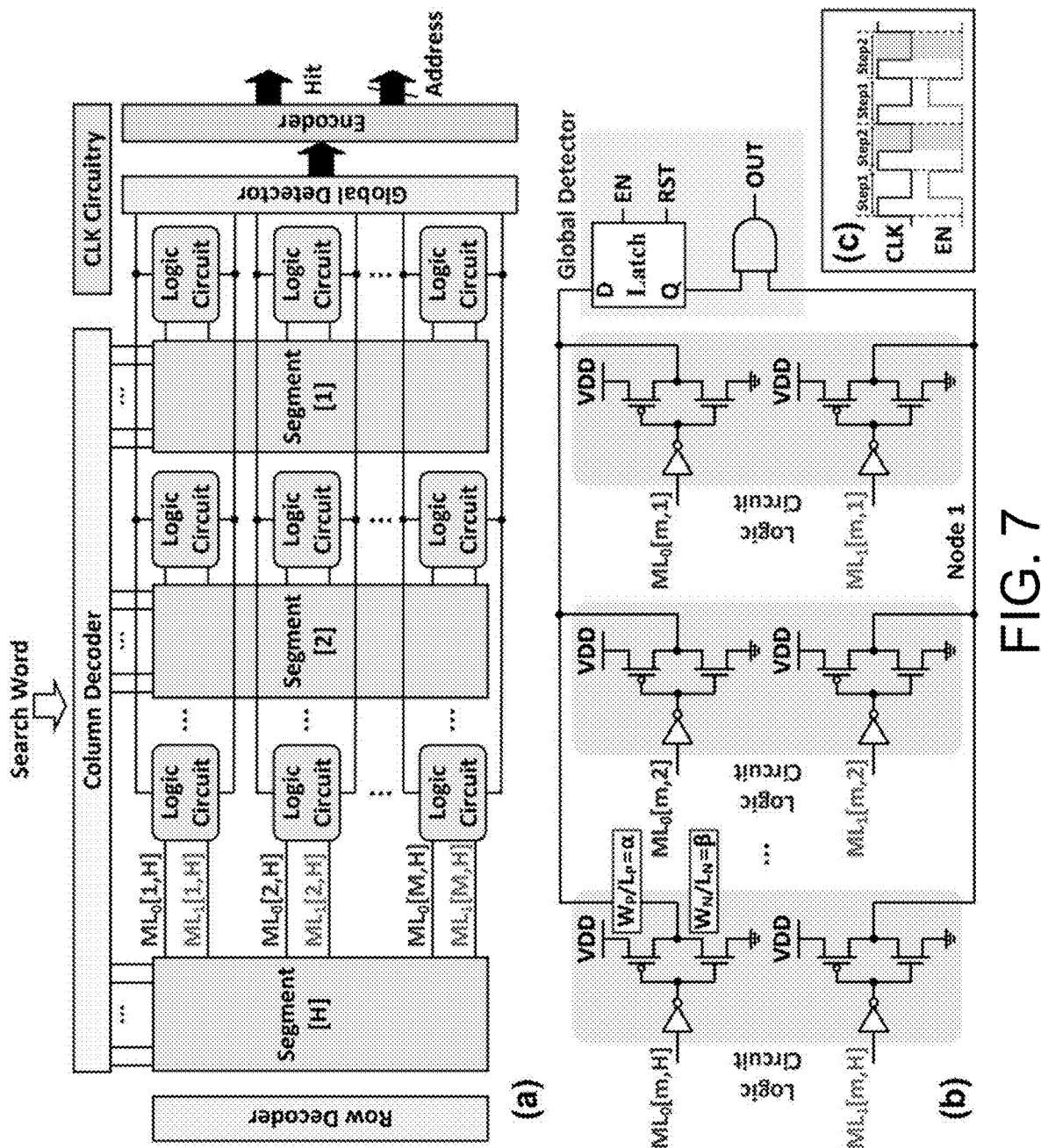
FIG. 7 is a schematic diagram of overall of a 1T-1MTJ CAM array in part (a) and an internal structure of a logic circuit and a global detector of the 1T-1MTJ CAM array in part (b) and a clock signal and a latch enabling signal of a segmented design of the 1T-1MTJ CAM array in part (c)

3. A Segmented Design Scheme of the 1T-1MTJ CAM Array:

As a search word length increases, the difference between the read voltage and the reference voltage becomes smaller, which would affect the search reliability. Therefore, the present invention provides a segmented design scheme to support a long byte search. As shown in part (a) of FIG. 7, the CAM array is segmented, and each segment contains reference rows, reference columns and a two-stage detection amplifier to generate the search result of each segment at the same time. Then, the search result of the whole row is obtained through the logic circuit and the global detector. FIG. 7 in part (b) explains internal structures of the logic circuit and the global detector, the output ML of each segment in the logic circuit is short-circuited together through a conventional inverter and a tilt inverter. The width to length ratio $\beta$ of NMOS in the tilt invertor is smaller than the width to length ratio $\alpha$ of PMOS, which makes the tilt invertor have strong pull-down effect. Therefore, only when the output of each segment is at a high level, the output of each segment logic circuit after short-circuited is at a high level, thus forming an AND logic. Then, in the global detector, the search result in the first step is connected to an AND gate by a D-latch and the search result in the second step is also connected to the AND gate to obtain the search result of the whole row. FIG. 7 in part (c) shows a relationship between the clock signal and an enabling signal of D latch. Finally, the global detector output is observed in the search stage of the second step. If the level is high, it indicates that the row matches. If the level is low, a mismatch has occurred for at least one segment.

The functions and effects of the present invention are further illustrated and demonstrated by the following simulation experiment:

1. Simulation Conditions

In the experiment, the MTJ is simulated using a physical-circuit-based compatible SPECTRE and SPICE Model with efficient design and analysis. The basic transistors use a 45 nm Predictive Technology Model (PTM) with a voltage of 1.1V. The key technical parameters of the MTJ set by the simulation are shown in the following table.

| Name of parameter | Detailed description | Default value |
| --- | --- | --- |
| D | Diameter of MTJ | 40 nm |
| $TMR_0$ | TMR rate without $V_{bias}$ | 150% |
| $T_{free}$ | Thickness of free layer | 1.3 nm |

-continued

| Name of parameter | Detailed description | Default value |
|---|---|---|
| $T_{oxide}$ | Thickness of oxide layer | 0.75 nm |
| R · A | Resistance value * area | 5Ω · μm² |
| ΔTMR | Process change rate of TMR rate | 3% |
| $\Delta T_{free}$ | Process change rate of thickness of oxide layer | 3% |
| $\Delta T_{oxide}$ | Process change rate of thickness of free layer | 3% |
| $V_{DD}$ | Power supply voltage | 1.1 V |

In the simulation, the CAM design of 1T-1MTJ is simulated using a SPECTRE software. In addition to the simulation of the CAM design in the present invention, we compare our results with five CAM designs proposed in a non-patent document 1 (A. T. Do, C. Yin, K. S. Yeo, and T. T.-H. Kim, "Design of a power-efficient cam using automated background checking scheme for small match line swing," in 2013 Proceedings of the ESSCIRC (ESSCIRC). IEEE, 2013, pp. 209-212), a non-patent document 2 (S. Matsunaga, A. Katsumata, M. Natsui, T. Endoh, H. Ohno, and T. Hanyu, "Design of anine-transistor/two-magnetic-tunnel-junctioncell-based low-energy nonvolatile ternary content-addressable memory," Japanese Journal of Applied Physics, vol. 51, no. 2S, p. 02BM06, 2012), a non-patent document 3 (B. Song, T. Na, J. P. Kim, S. H. Kang, and S.-O. Jung, "A 10t-4mtj nonvolatile ternary cam cell for reliable search operation and a compact area," IEEE Transactions on Circuits and Systems II: Express Briefs, vol. 64, no. 6, pp. 700-704, 2016), a non-patent document 4 (C. Wang, D. Zhang, L. Zeng, E. Deng, J. Chen, and W. Zhao, "A novel mtj-based non-volatile ternary content-addressable memory for high-speed, low-power, and high-reliable search operation," IEEE Transactions on Circuits and Systems I: Regular Papers, vol. 66, no. 4, pp. 1454-1464, 2018) and a non-patent document 5 (C. Wang, D. Zhang, L. Zeng, and W. Zhao, "Design of magnetic nonvolatile tcam with priority-decision in memory technology for high speed, low power, and high reliability," IEEE Transactions on Circuits and Systems I: Regular Papers, vol. 67, no. 2, pp. 464-474, 2019).

The comparison metrics mainly include the number of transistors, the area of each CAM cell, write energy consumption of each CAM cell per write, search error rate, search delay and search energy consumption of each CAM cell per search. For the CAM design in the present invention, the measurement of the search error rate and search delay is in a worst case, that is, only one CAM cell does not match; the average energy consumption of writing unit data "0" and writing unit data "1" is taken as the write energy consumption. The measurement of search energy consumption is done by using an average case where half of the CAM cells in a row match.

2. Simulation Results

Figure 8:
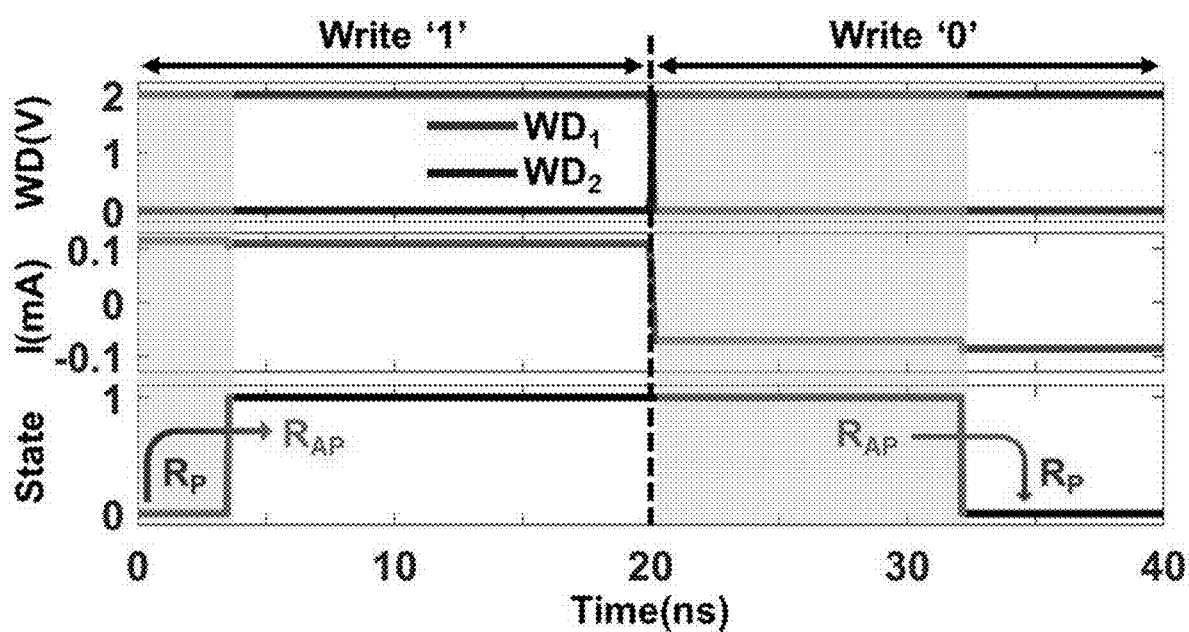
FIG. 8 is simulation waveforms of writing "0" and "1" in a 1T-1MTJ CAM cell.

1) Functional Verification of the 1T-1MTJ CAM 1.1) FIG. 8 is simulation waveforms of writing "0" and "1" in the 1T-1MTJ CAM cell. The MTJ cell is initially in a parallel state, enabling $EN_{TG}$ and WL to control the transmission gate EN and the transistor of 1T-1MTJ cell conduction respectively. SL is set to zero, two write drivers $WD_1$ and $WD_2$ are set to be 2V and ground respectively to generate a write current, so that the MTJ becomes in an anti-parallel state. Then, the write drivers $WD_1$ and $WD_2$ are set to ground and 2V respectively, and the MTJ changes from the anti-parallel state back to the parallel state, so as to complete the verification of the write function.

Figure 9:
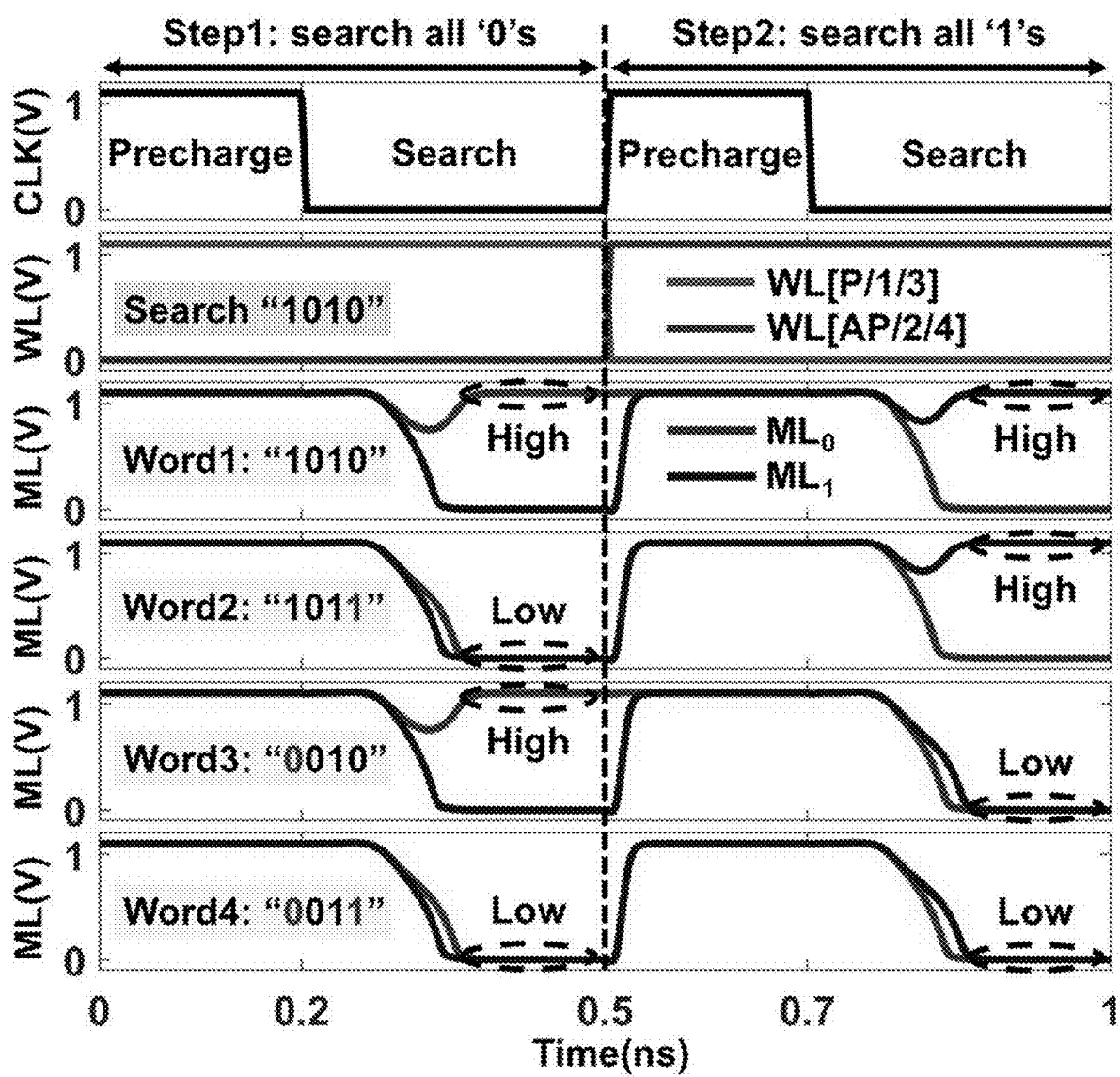
FIG. 9 is simulation waveforms of a 1T-1MTJ CAM array using a two-step search scheme to search "1010" for stored contents "1010", "1011", "0010" and "0011"

1.2) FIG. 9 shows simulation waveforms of a 1T-1MTJ CAM array using a two-step search scheme to search "1010" for stored contents "1010", "1011", "0010" and "0011". Enabling SL to generate the search current $I_{SEARCH}$, $EN_{TG}$ is set to zero to turn off the transmission gate. In the first step of search, WL[P] corresponding to the reference column for storing "0" and WL[1] and WL[3] corresponding to all "0" bits in the search sequence are enabled. When CLK is low, $ML_0$ storing contents "1011" and "0011" becomes low, indicating that there is a mismatch condition that "1" is stored while "0" is searched. In the second step, WL[AP] corresponding to the reference column storing "1" and WL[2] and WL[4] corresponding to all "0" bits in the search sequence are enabled. When CLK is low, $ML_1$ storing contents "0010" and "0011" becomes low, indicating that there is a mismatch condition that "0" is stored while "1" is searched. Combining the above two steps, only the $ML_0$ storing content "1010" remains high in the first step and $ML_1$ remains high in the second step, indicating a match, and the remaining three rows do not match, thus completing the verification of the search function.

2) Write Speed and Write Energy Consumption Analysis

Figure 10:
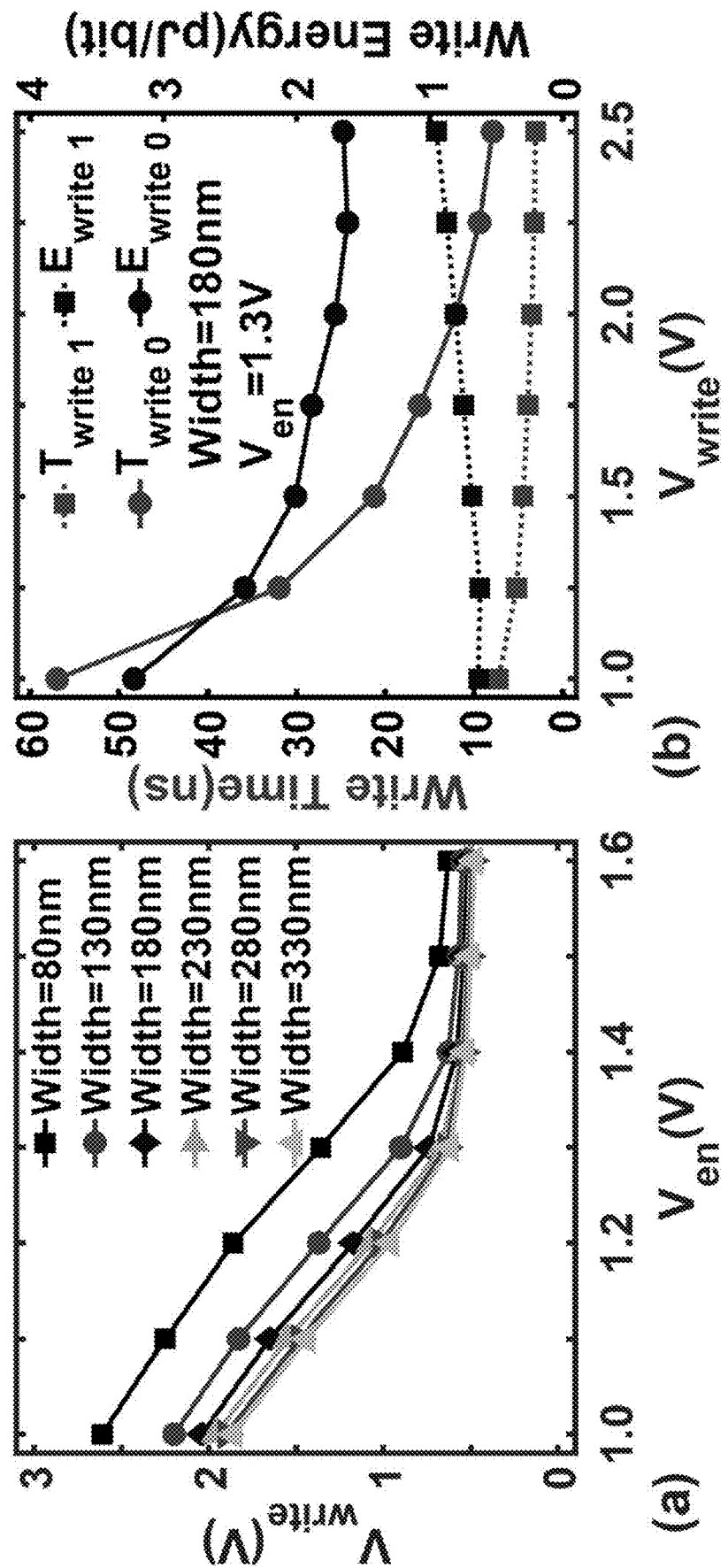
FIG. 10 is a diagram of a relationship between a minimum write voltage ($V_{WRITE}$) required to complete a write operation under different transmission gate transistor widths and an enabled voltage ($V_{en}$) on WL and $EN_{TG}$ in part (a), and a relationship between write time and write energy consumption per bit and $V_{WRITE}$ in part (b)

The setting of the transfer gate transistor width, the enabling voltage $V_{en}$ on WL and $EN_{TG}$ and the write voltage $V_{WRITE}$ on the write driver WD would affect the write efficiency of the 1T-1MTJ CAM array. FIG. 10 in part (a) shows the relationship between the minimum $V_{WRITE}$ required to complete the write operation and $V_{en}$ on the WL and $EN_{TG}$ under different transmission gate transistor widths. It can be seen that the required minimum $V_{WRITE}$ decreases with the increase of $V_{en}$, while a large transmission gate transistor width can also lead to the reduced minimum $V_{WRITE}$. In order to suppress area overhead and avoid transistor breakdown, the width of NMOS (PMOS) transistor in the transmission gate is set as 180 nm (360 nm), and the size of $V_{en}$ is 1.3V. In this configuration, the write speed and write energy consumption under different sizes of $V_{WRITE}$ are explored as shown in part (b) of FIG. 10. With the $V_{WRITE}$ increases, the write time becomes shorter. When $V_{WRITE}$ is 2V, each write can be completed within 20 ns as shown in FIG. 8, and the average energy consumption of each write is 1.26 pJ/bit.

3) Search Reliability Analysis

Figure 11:
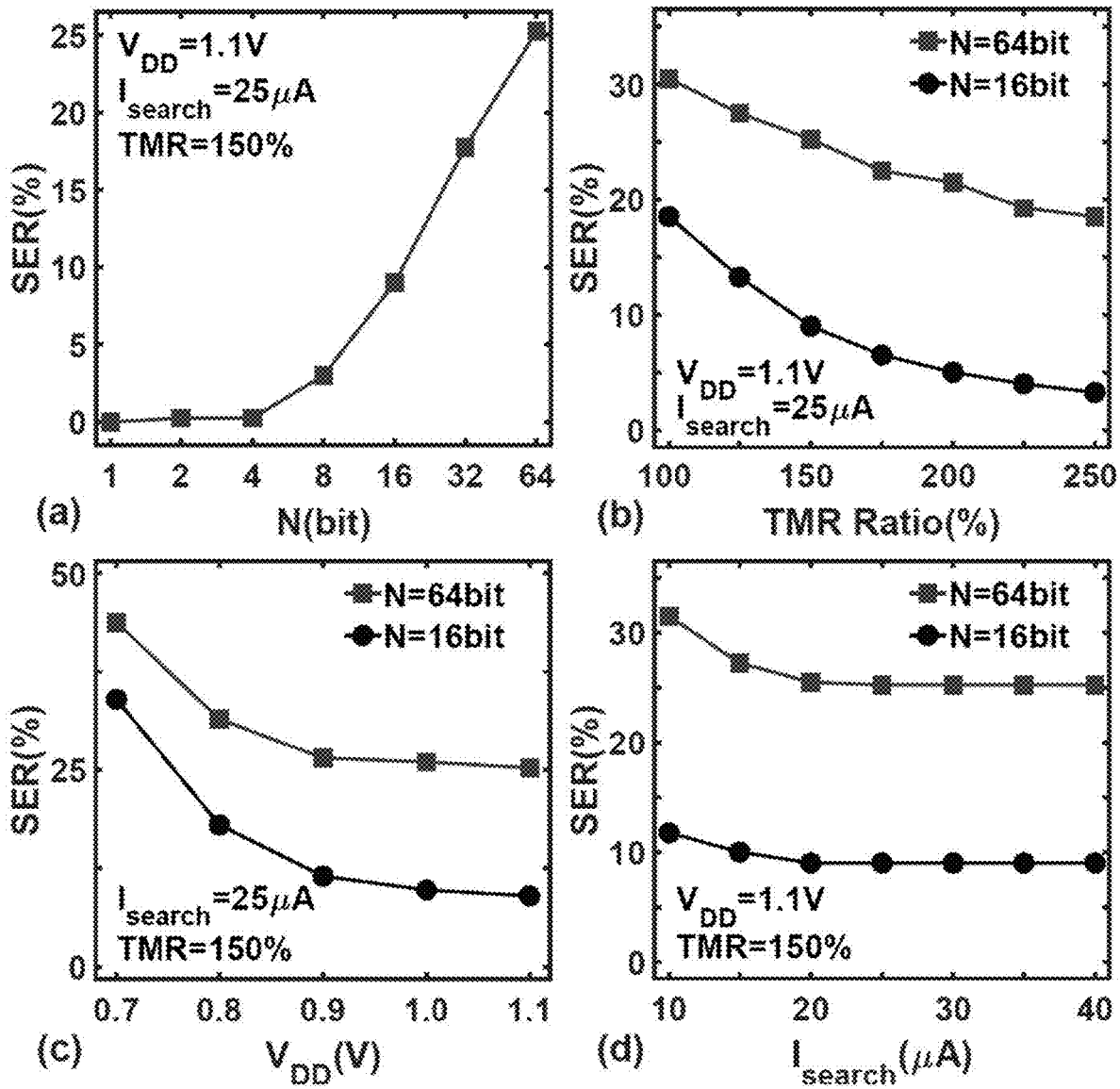
FIG. 11 is a diagram of the relationship between a Search-Error-Rate (SER) and word length N of a 1T-1MTJ CAM array in a worst case in part (a), a relationship between the SER and TMR rate of a 1T-1MTJ CAM array in a worst case in part (b), a relationship between the SER and supply voltage $V_{DD}$ of a 1T-1MTJ CAM array in a worst case in part (c), and a relationship between the SER and a search current of a 1T-1MTJ CAM array in a worst case in part (d)

Under the premise that the process change rate of MTJ TMR rate, oxide layer thickness and free layer thickness is set as 3%, and the process change rate of transistor width and threshold voltage is set as 10%, the search error rate (SER) is obtained by performing a Monte Carlo simulation with only one CAM cell mismatch to perform search reliability analysis. FIG. 11 in part (a) shows that as the search word length N increases, SER also increases gradually, so segmented design is needed to ensure the search reliability. On the other hand, as shown in part (b) of FIG. 11, the increase of TMR rate of MTJ would lead to the increase of read voltage gap between different states of 1T-1MTJ CAM cell, thus reducing SER. At the same time, when the supply voltage increases, the current difference between the two discharge branches in the second-stage dynamic latch voltage comparator of SA would also increase, leading to the decrease of SER. FIG. 11 in part (d) shows that when the search current $I_{SEARCH}$ is too small, SA is difficult to accurately compare the voltage difference, thus introducing additional SER. However, when $I_{SEARCH}$ is greater than 25 μA, the effect on SER is negligible.

4) Search Delay and Search Energy Consumption Analysis

Figure 12:
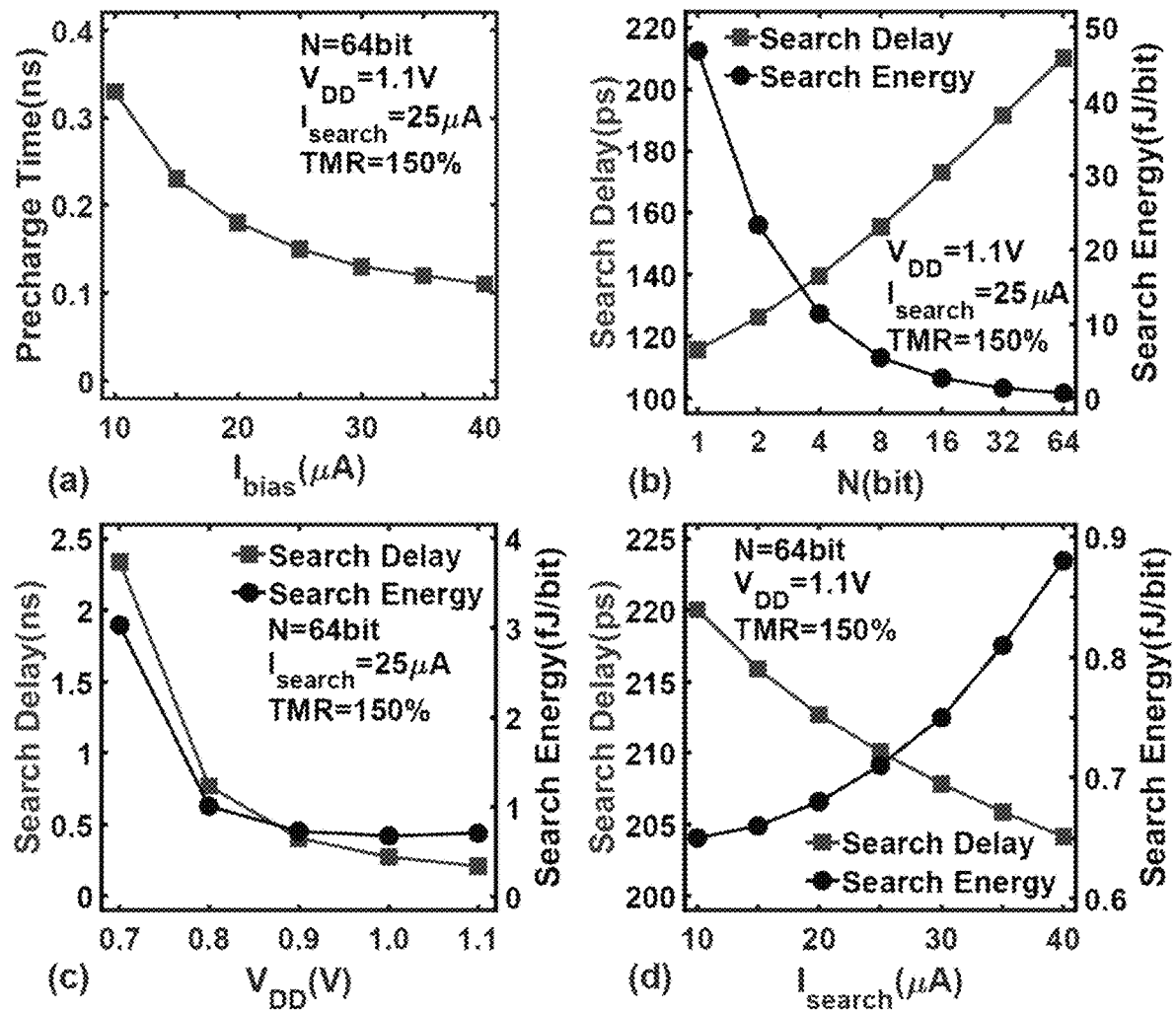
FIG. 12 is a diagram of relationships between a minimum preparation time required to complete a search operation and a bias current of a first-stage differential pre-amplifier in part (a), and relationships between a search delay and search energy consumption per bit and a word length N in part (b), relationships between a search delay and search energy consumption per bit and a supply voltage $V_{DD}$ in part (c), and relationships between a search delay and search energy consumption per bit and a search current for a 1T-1MTJ CAM array in part (d).

After confirming the search reliability of the 1T-1MTJ CAM design, it is necessary to analyze the search delay and search energy consumption. In the precharging stage (CLK is at a high level), not only the output of SA needs to be precharged to a high level, but also the first differential pre-amplifier needs to prepare two voltage signals for the input of the second stage to participate in the comparison, so that the SA can produce the comparison results when CLK becomes low. Therefore, when the bias current is increased to improve the bandwidth of the first stage, as shown in part (a) of FIG. 12, the time required for the precharge stage would be reduced. In addition, FIG. 12 in part (b) shows that the search delay increases with the increase of the word length N, which is caused by the increase of parasitic capacitance on the BL. At the same time, the energy consumption per unit search shows an opposite trend, which has two reasons: (1) the voltage on the BL decreases as the word length N increases, and (2) the search time does not increase substantially as the word length N increases. FIG. 12 in part (c) shows that a higher supply voltage can reduce the search delay and further improve the search energy efficiency. FIG. 12 in part (d) shows that with the increase of $I_{SEARCH}$, the voltage difference between the read voltage and the reference voltage increases, which reduces the search delay, but also reduces the search energy efficiency.

5) Performance Comparison

The following table presents the comparison of the metrics of the CAM design based on the single MTJ in the present invention with other CAM designs.

| REFERENCE DOCUMENTS | Non-patent document 1 | Non-patent document 2 | Non-patent document 3 | Non-patent document 4 | Non-patent document 5 | The present invention |
|---|---|---|---|---|---|---|
| Non-volatility | No | Yes | Yes | Yes | Yes | Yes |
| Cell structure | 10T | 9T-2MTJ | 10T-4MTJ | 15T-4MTJ | 20T-6MTJ | 1T-1MTJ |
| Cell plane ($\mu m^2$) | 3.3 | 6.84 | 8.28 | 10.76 | 18.05 | 0.06 |
| SER (144-bit) | 0 | 30.0% | 18.5% | 2.7% | 2.7% | 8.3% |
| Search delay (ns) | 1.07 | 0.20 | 1.28 | 0.17 | 0.17 | 0.17 |
| Search energy consumption (fJ/bit) | 0.77 | 37.37 | 5.07 | 0.17 | 1.06 | 2.72 |
| Writing energy consumption (pJ/bit) | 0.03 | 0.55 | 5.79 | 1.59 | 2.38 | 1.26 |

The above table summarizes the technical metrics of the 1T-1MTJ CAM and other CAMs, in which the word length of segment of the 1T-1MTJ CAM is set to 16 bit per segment. As can be seen from the above table, the cell area of the 1T-1MTJ CAM in the present invention is 1.82% of that of the 10T cell based on the traditional CMOS technology, and this advantage is further amplified when compared with other MTJ-based CAMs. Although the 1T-1MTJ CAM needs the reference rows, reference columns, and SAs to complete the search operation, these additional area overhead is negligible when performing the long byte search, and the search delay of the 1T-1MTJ CAM is only 16% of that of 10T CAM. Although the search energy consumption of 15T-4MTJ/20T-6MTJ CAMs is lower than that of the 1T-1MTJ CAM, the area overhead is much higher. In addition, the search energy consumption of the 1T-1MTJ CAM would be further reduced when the word length of the segment increased. At the same time, because there are fewer MTJs and transistors in the writing path of the 1T-1MTJ CAM, compared with 10T-4MTJ/15T-4MTJ/20T-6MTJ CAM, the writing energy efficiency is increased by 4.60 times/1.26 times/1.89 times. Although the writing energy consumption of 9T-2MTJ CAM is lower, the search error rate of 1T-1MTJ CAM is only 28% of that of 9T-2MTJ CAM.

It can be seen from the above results that the present invention not only has non-volatility which is difficult to be achieved by the CMOS design, and robustness against the process changes, but also has the characteristics of compact design, low energy consumption and low delay. In addition, the above results also validate the effectiveness of the 1T-1MTJ CAM array utilizing the two step search scheme and the segmented design in the data-intensive search applications.

The above embodiments are used to explain the present invention, not to restrict it, and without departing from the spirit and protection scope of claims in the present invention, any modification or alteration made to the present invention falls within the protection scope of the present invention.

What is claimed is:

1. An ultra-compact content addressable memory (CAM) array based on a single magnetic tunnel junction (MTJ), wherein the CAM array comprises an M*N CAM core for storing contents, additional reference rows for storing "0" and "1" and reference columns for storing "0" and "1", a row decoder, a column decoder, transmission gates ENs, write drivers WDs, search current source $I_{search}$s, and two-stage detection amplifiers, wherein all 1T-1MTJ cells in the reference row for storing "0" and the reference column for storing "0" store data "0", all 1T-1MTJ cells in the reference row for storing "1" and the reference column for storing "1" store data "1", and at the intersection of the two reference rows and the two reference columns are four 2T cells for ensuring that a reference voltage on the BL of the reference row is different from read voltages of the other storage rows during the search.

2. The ultra-compact CAM array based on a single MTJ according to claim 1, wherein the CAM core comprises M*N CAM cells, and each CAM cell comprises 1MTJ and 1NMOS;

two terminals of the MTJ in each CAM cell are respectively connected with a bit line BL and drain of an NMOS, gate of the NMOS is connected with a word line WL, and source of the NMOS is connected with another bit line BLB;

bit lines of the CAM cells in each row in the CAM array are connected to each other, and each column shares the same longitudinal WL.

3. The ultra-compact CAM array based on a single MTJ according to claim 1, wherein the row decoder controls the transmission gates ENs and the search current sources $I_{search}$s, the column decoder controls the WLs, the write drivers WDs are divided into write drivers $WD_1$s and write drivers $WD_2$s, the write drivers $WD_1$s are connected to the BLs through the transmission gates ENs, the write drivers $WD_2$s are connected to the BLBs, the BL of each storage row in the CAM core is connected to positive inputs of two two-stage detection amplifiers SAs, and the two-stage detection amplifier SAs are divided into two-stage detection amplifiers $SA_0$s and two-stage detection amplifiers $SA_1$s, the BL of the reference row for storing "0" connects to negative inputs of all the two-stage detection amplifiers $SA_0$s, and the BL of the reference row for storing "1" connects to negative inputs of all the two-stage detection amplifiers $SA_1$s.

4. The ultra-compact CAM array based on a single MTJ according to claim 1, wherein two types of storing are performed on the MTJ by a bidirectional current generated by two write drives WDs in each row: "0" and "1".

5. The ultra-compact CAM array based on a single MTJ according to claim 1, wherein during the search, a read voltage and the reference voltage are respectively generated on the BLs of the storage row and the reference row by the search current source $I_{search}$, and information about match or not is obtained through the two two-stage detection amplifiers SAs in each row.

6. The ultra-compact CAM array based on a single MTJ according to claim 1, wherein the two-stage detection amplifier SA comprises a first differential pre-amplifier and a second-stage dynamic latch voltage comparator.

7. An operating method for the CAM array according to claim 1, wherein the operating method comprises:
   before the CAM array starts to work, data storage is performed on each cell, that is, after the information is encoded into a binary sequence, the 1MTJ is written through a bidirectional current;
   for each search operation, a two-step search scheme is utilized:
   a first step: enabling a WL corresponding to all "0" bits in a search sequence and a WL in the reference column for storing "0", setting WLs of the remaining columns to 0, letting BLB be grounded, applying the search current to generate a read voltage $V_{SEARCH0}$ on a storage row BL and generate a reference voltage $V_{REF0}$ on BL of the reference row for storing "0", and when a clock signal CLK is at a high level, precharging the two output terminals of the two-stage detection amplifier $SA_0$ to a high level; when the CLK goes low, if the row has a mismatch condition that "1" is stored while "0" is searched, letting $V_{SEARCH0}$ be greater than $V_{REF0}$, so that a reverse output terminal $ML_0$ of the two-stage detection amplifier $SA_0$ is pulled down to ground; and if the row matches, remaining $ML_0$ at a high level;
   a second step: enabling a WL corresponding to all "1" bits in a search sequence and a WL in the reference column for storing "1", setting WLs of the remaining columns to 0, letting BLB be grounded, applying the search current to generate a read voltage $V_{SEARCH1}$ on a storage row BL and generate a reference voltage $V_{REF1}$ on the reference row BL for storing "1", and when a clock signal CLK is at a high level, precharging the two output terminals of the two-stage detection amplifier $SA_1$ to a high level; when the CLK goes low, if the row has a mismatch condition that "0" is stored while "1" is searched, letting $V_{SEARCH1}$ be smaller than $V_{REF1}$, so that a positive output terminal $ML_1$ of the two-stage detection amplifier $SA_1$ is pulled down to ground; and if the row matches, remaining $ML_1$ at a high level;
   when a segmentation design is utilized for performing a long-byte search, the ML of each segment is shorted by a logic circuit to obtain search results of the first step and/or the second step, and in a global detector, the search result in the first step is connected to an AND gate by a D-latch and the search result in the second step is also connected to the AND gate to obtain the search result of the whole row; and in the search phase of the second step, the output of the AND gate is observed, and the row matches if the output is at a high level.

* * * * *